United States Patent [19]

Ishiguro

[11] Patent Number: 5,404,586

[45] Date of Patent: Apr. 4, 1995

[54] TRANSMITTER HAVING AUTOMATIC POWER CONTROLLER

[75] Inventor: Hironobu Ishiguro, Sendai, Japan

[73] Assignee: Fujitsu Ltd., Japan

[21] Appl. No.: 953,499

[22] Filed: Sep. 29, 1992

[51] Int. Cl.$^6$ .............................................. H04B 1/04
[52] U.S. Cl. .................................. 455/126; 455/127; 307/29
[58] Field of Search .................... 455/126, 127, 89; 307/18, 24, 28, 29

[56] References Cited

U.S. PATENT DOCUMENTS

| | | | |
|---|---|---|---|
| 3,755,689 | 8/1973 | Woods | 307/28 X |
| 4,835,408 | 5/1989 | Kay et al. | 307/24 |
| 5,193,219 | 3/1993 | Tamura | 455/127 |
| 5,293,695 | 8/1993 | Jung | 455/126 |

Primary Examiner—Edward F. Urban
Attorney, Agent, or Firm—Greer, Burns & Crain, Ltd.

[57] ABSTRACT

A transmitter having an automatic power controller (APC). The APC switches the output power of the transmitter in a plurality of steps by gain control. The APC selects a desired one of a plurality of mutually independent variable voltage sources in accordance with an external command to obtain the offset voltage. The offset voltage is used for the gain control. The APC also can finely adjust the voltage output from the variable voltage sources in accordance with the external command independently of the other variable voltage sources.

12 Claims, 8 Drawing Sheets

TRANSMITTER HAVING AUTOMATIC POWER CONTROLLER

BACKGROUND OF THE INVENTION

1. Field of the Invention

The present invention relates to a transmitter having an automatic power controller which switches the output power of a mobile communication terminal, cellular telephone set, or the like in a step-wise fashion by an external control signal so as to hold the same constant.

A transmitter functioning as a mobile communication terminal is not used under continuously constant conditions. It may be used, for example, somewhere close to a communication base station or somewhere outside of a service area far from the communication base station. Further, it may be used at high temperature locations or low temperature locations. In addition, when the transmitter is driven using a car battery as its power source, it is influenced by the fluctuations in the voltage of the battery.

Therefore, an automatic power controller (APC) is essential for a transmitter functioning as a terminal for, for example, mobile communication. Further, it is usually desirable to be able to switch the output power of the transmitter in a number of steps so as to adjust the same.

2. Description of the Related Art

As will be explained in detail later, the conventional transmitter with an APC is mainly comprised of a radio frequency power amplifier which amplifies a radio frequency input signal by a gain determined in accordance with a control voltage; a first means which branches and receives a radio frequency output signal from the radio frequency power amplifier, produces a voltage proportional to the deviation of the received voltage from a threshold voltage, and gives feedback to the radio frequency power amplifier using this as the control voltage; and a second means which generates an offset voltage to be superposed on the threshold voltage in accordance with an external command, wherein the second means is comprised of a multiplexer which outputs the offset voltage; series resistors comprised of a group of constant resistors which supply a variety of types of offset voltages to the multiplexer; and a variable resistor which is connected to one end of the series resistors. The variable resistor is for fine adjustment of the offset voltage at the time of factory shipment of the transmitter.

The above-mentioned conventional transmitter with an APC, however, had the following problem:

i) Assume there is a desire to finely adjust one of the offset voltages among the plurality of offset voltages obtainable from the intermediate connecting points of the series resistors. The resistance value of the variable resistor is finely adjusted to obtain this desired offset voltage. Even if the offset voltage has become the desired amplitude, however, since the resistance value of the variable resistor was changed, all the other offset voltages end up slightly deviating from the optimum voltage values. This is the first problem.

ii) After the variable resistor is adjusted manually at the time of factory shipment, it is not easy for the user to adjust the same. Therefore, it is not possible to adjust the offset voltages during use of the transmitter. This is the second problem.

In addition, as mentioned in i) above, during the operation of the transmitter, it is not possible to adjust the offset voltages independently from each other.

iii) A conventional APC is comprised of a group of a plurality of constant resistors and a single variable resistor, as mentioned earlier. Therefore, there is the third problem that it is difficult to make the resistors by an integrated circuit (IC) when fabricating the internal circuits of the transmitter in an IC. This proves to be a hindrance when trying to reduce the size of the transmitter.

SUMMARY OF THE INVENTION

Therefore, the object of the present invention is to provide a transmitter with an APC which enables the plurality of types of offset voltages in the APC to be adjusted independently of each other and even during the operation of the transmitter and whereby the APC can be easily fabricated in an IC.

To attain the above object, the present invention has the above-mentioned second means comprised as follows: That is, the second means is comprised of a plurality of offset voltage sources which generate mutually independently preset offset voltages in accordance with an external command and a selector which controls the multiplexer so as to select from the plurality of offset voltage sources the one offset voltage source corresponding to the offset voltage to be applied to the first means.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the prior art and the problems therein will be first described with reference to the related figures.

Figure 1:
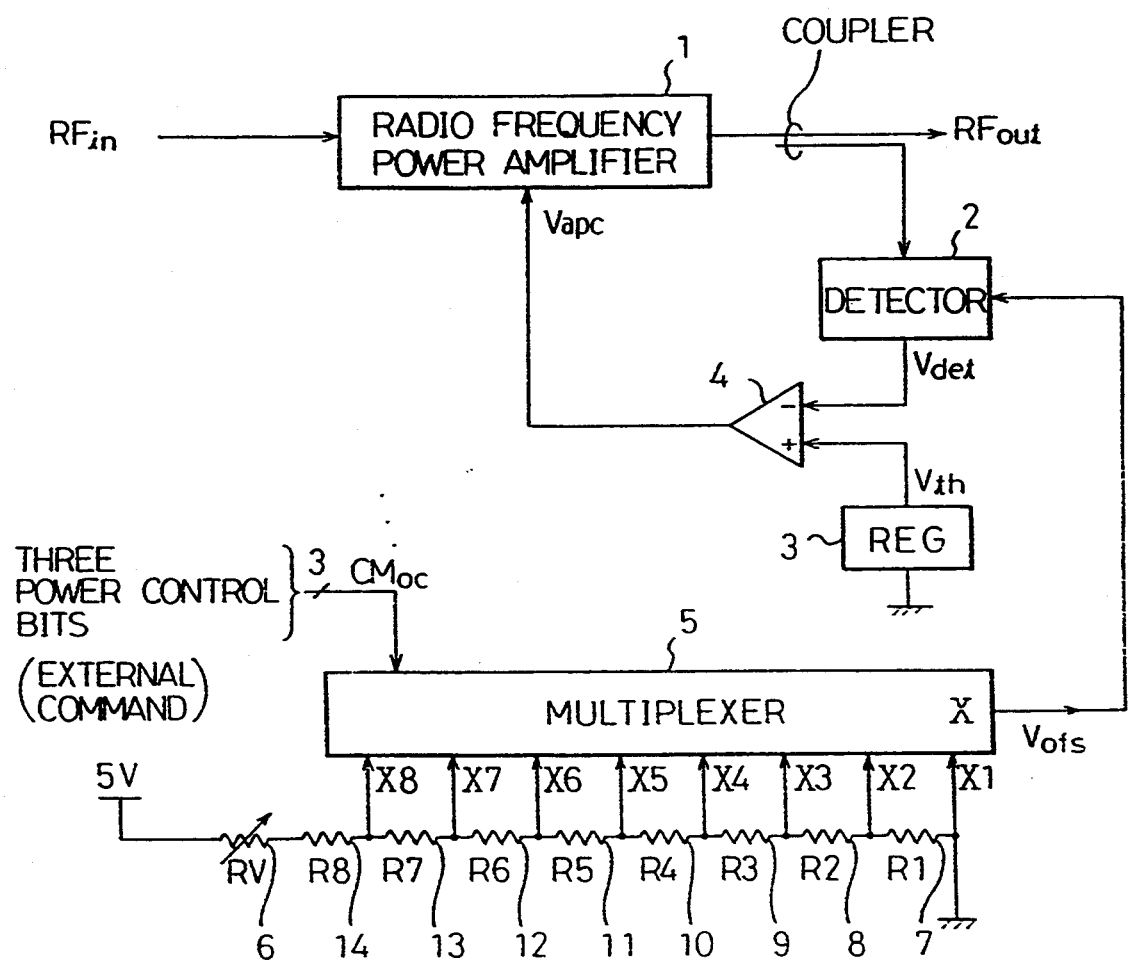
FIG. 1 is a view of an example of the construction of a conventional transmitter with an APC.

FIG. 1 is a view of an example of the construction of a conventional transmitter with an APC. In the figure, reference numeral 1 is a radio frequency power amplifier which receives a radio frequency input signal RFin, amplifies the same, and outputs a radio frequency output signal RFout. This signal RFin is amplified with a gain determined in accordance with an automatic power control voltage Vapc.

To generate the control voltage Vapc, first, the radio frequency output signal from the amplifier 1 is branched, for example, by a coupler, then the branched signals are received by a detector 2. The detector 2 detects the received signals and outputs a detection voltage Vdet. The voltage Vdet is applied to one input of a differential amplifier 4. At the other input of the differential amplifier 4, a threshold voltage Vth is applied. Note that the voltage Vth is produced by a voltage regulator (REG).

The differential amplifier 4 receives as input the two types of voltages Vdet and Vth and outputs a voltage proportional to the deviation of the detected voltage Vdet from the threshold voltage Vth, which output voltage becomes the above automatic power control voltage.

The transmitter, as mentioned above, must be able to switch the output power in steps to adjust the same. Therefore, one of a plurality of types of offset voltages Vofs is selected and superposed on the automatic power control voltage Vapc. This offset voltage Vofs is output by a multiplexer 5. The multiplexer 5 cooperates with series resistors comprised of a group of constant resistors 7 to 14 (resistance values of R1 to R8) and a variable resistor 6 (resistance value of RV) connected to one end of the same and thus receives eight offset voltages X1 to X8. Which one of the offset voltages X1 to x8 is to be selected by the multiplexer 5 and made the offset voltage Vofs is indicated by an external command CMoc. This external command CMoc is given, for example, as 3-bit power control data.

Assuming now that the output level of the radio frequency output signal RFout has increased over the desired level (corresponding to the above-mentioned threshold voltage Vth), the detection voltage Vdet rises proportionally to the same. This detection voltage Vdet is connected to the (−) side of the input of the differential amplifier 4. The amount of rise, or the result of the comparison with the threshold voltage Vth input to the (+) side, is inverted and amplified by the differential amplifier 4, whereby the control voltage Vapc falls. If the control voltage Vapc falls, the gain of the radio frequency power amplifier 1 decreases and, for the APC, the output level of the output signal RFout tries to return to the desired value. Conversely, if the output level of the radio frequency output signal RFout falls from the desired value, the detection voltage Vdet falls, the amount of the fall is inverted and amplified by the differential amplifier 4, the control voltage Vapc rises, and the gain of the radio frequency power amplifier 1 rises, whereby the output level rises to the desired value.

On the other hand, the offset voltage Vofs which is output from the multiplexer 5 switches the output power of the radio frequency output signal RFout in eight steps. When the offset voltage Vofs is applied to a detection diode in the detector 2, the detection voltage Vdet is forced to rise, so the control voltage Vapc falls. In the conventional example shown in FIG. 1, to generate these eight offset voltages, the fixed DC voltage 5V is divided into eight by the constant resistors (R1 to R8). The offset voltages X1 to X8 are supplied to the eight input ports of the multiplexer 5 where a desired one of them is selected and output in accordance with a command CMoc. The eight offset voltages X1 to X8 are as follows:

$X8 = 5 \times (R1+R2+R3+R4+R5+R6+R7)/(RV+R1+R2+R3+R4+R5+R6+R7+R8)$ V $X7 = 5 \times (R1+R2+R3+R4+R5+R6)/(RV+R1+R2+R3+R4+R5+R6+R7+R8)$ V $X6 = 5 \times (R1+R2+R3+R4+R5)/(RV+R1+R2+R3+R4+R5+R6+R7+R8)$ V $X5 = 5 \times (R1+R2+R3+R4)/(RV+R1+R2+R3+R4+R5+R6+R7+R8)$ V $X4 = 5 \times (R1+R2+R3)/(RV+R1+R2+R3+R4+R5+R6+R7+R8)$ V $X3 = 5 \times (R1+R2)/(RV+R1+R2+R3+R4+R5+R6+R7+R8)$ V $X2 = 5 \times (R1)/(RV+R1+R2+R3+R4+R5+R6+R7+R8)$ V $X1 = 0$ V One of these eight offset voltages is selected by the 3-bit power control data by the external command CMoc and is applied to the detection diode in the detector 2 as the offset voltage Vofs.

The conventional transmitter having an APC mentioned above, however, suffers from the above-mentioned first, second, and third problems and therefore is not desirable. The transmitter having an APC according to the present invention is able to simultaneously solve these three problems.

Figure 2:
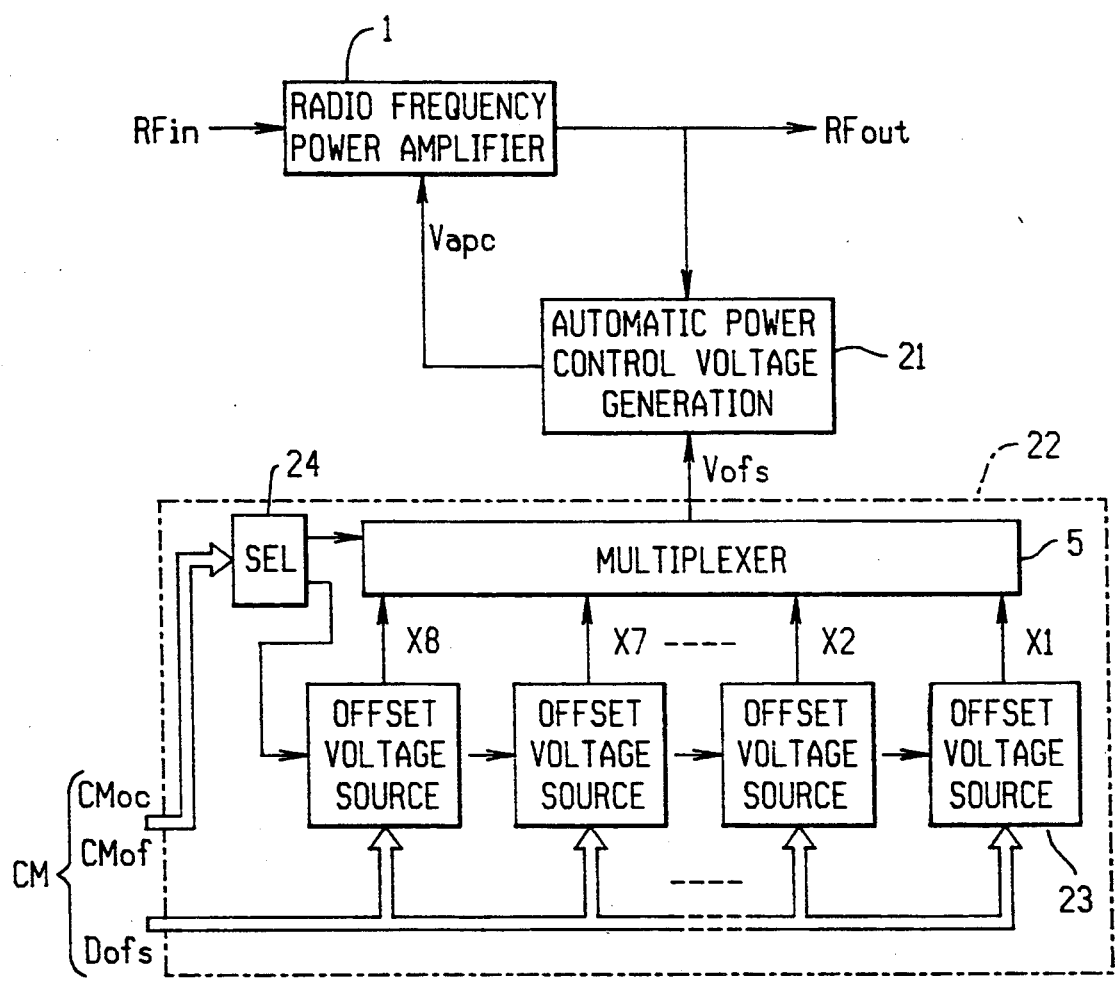
FIG. 2 is a view of the basic construction of a transmitter with an APC according to the present invention.

FIG. 2 is a view of the basic construction of a transmitter with an APC according to the present invention. Note that throughout the figures, similar component elements are shown with the same reference numerals or symbols. In FIG. 2, the transmitter having an automatic power controller according to the present invention comprises a radio frequency power amplifier 1 which amplifies a radio frequency input signal RFin by a gain determined in accordance with an automatic power control voltage; a first means 21 which branches and receives a radio frequency output signal RFout from the radio frequency power amplifier 1, produces a voltage proportional to the deviation of the received voltage from a threshold voltage Vth, and gives feedback to the radio frequency power amplifier using this as the control voltage Vapc; and a second means 22 which generates an offset voltage Vofs to be superposed on the threshold voltage Vth in accordance with an external command CM. Here, the second means 22 is comprised of a multiplexer which outputs the offset voltage Vofs; a plurality of offset voltage sources 23 which generate mutually independently preset offset voltages Vofs in accordance with the external command CM; and a selector 24 which controls the multiplexer 5 so as to select one offset voltage source 23 independently generating an offset voltage Vofs from among the plurality of offset voltage sources and select from among the plurality of offset voltage sources 23 in accordance with the external command CM the one offset voltage source corresponding to the offset voltage Vofs to be given to the first means 21.

Figure 3:
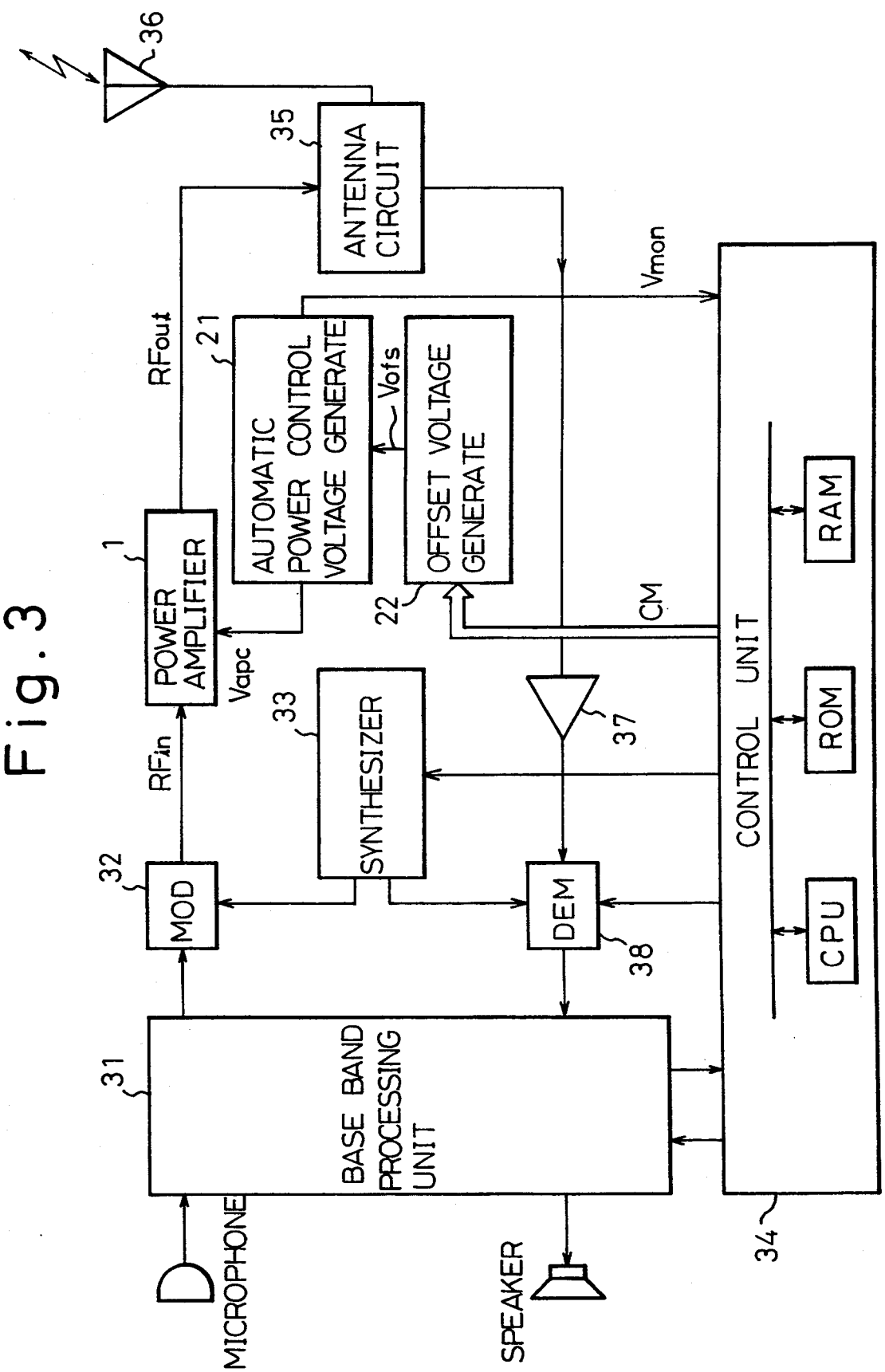
FIG. 3 is a view of an example of the transmitter with an APC of FIG. 2 as a whole.

FIG. 3 is a view of an example of the transmitter with an APC of FIG. 2 as a whole. However, the overall construction shown in the figure per se is known. In the figure, the constituent elements shown in FIG. 2 are given the reference numerals 1, 21, and 22.

The radio frequency input signal RFin is given from a modulator (MOD) 32. The radio frequency output signal RFout is subjected to filtering processing by an antenna circuit 35, then is radiated from an antenna 36 to a base station (not shown).

The change of the output level of the radio frequency output signal RFout is usually instructed by the base station. This command signal is received by the antenna 36 together with the usual speech signals and is applied to a demodulator (DEM) 38 through a low noise amplifier 37 to be reproduced to base band signals. The base band command signals are applied through a base band processing unit 31 to a control unit 34. The control unit 34 produces the above-mentioned external command CM in accordance with the command signal and applies the same to the second means 22. Note that in the invention, as the external command CM, it is possible to not only use one given from the base station, but also one obtained by monitoring the conditions inside the transmitter (see output Vmon of detector 2 in FIG. 4) and issuing an external command CM by the results of the monitoring.

Returning once again to FIG. 2, the selector (SEL) 24 successively selects the plurality of offset voltage sources 24 and presets the offset voltages to be allocated to the same in accordance with the external command CMof, thereby setting the offsets.

The selector 24 further leaves the state of selection in the multiplexer 5 as it is when the transmitter is transmitting, selects one of the offset voltage sources 23 in the selected state, and performs further final adjustment on the selected offset voltage vofs in accordance with the external command CMof.

In the above initial state, the external command CM is issued in accordance with offset information stored in advance in a read only memory (ROM) (see FIG. 3) provided in the transmitter. However, when the transmitter is transmitting, as mentioned earlier (FIG. 3), the external command CM is a command issued and transmitted at an opposing base station with which the transmitter is communicating and received at the transmitter. Note that the command is stored once in a random access memory (RAM) (see FIG. 3).

As mentioned earlier, the external command CM need not be given from the base station. According to the present invention, a command occurring inside the transmitter may be made the external command as well. For example, the external command may be a command issued in the transmitter in accordance with the results of monitoring of the radio frequency output signal RFout received in the first means 21. For example, when the results of the monitoring detect that the output level of the signal RFout is extremely low or high for some reason or another, a command CM in accordance with this may be automatically produced by the central processing unit CPU in the control unit 34.

Figure 4:
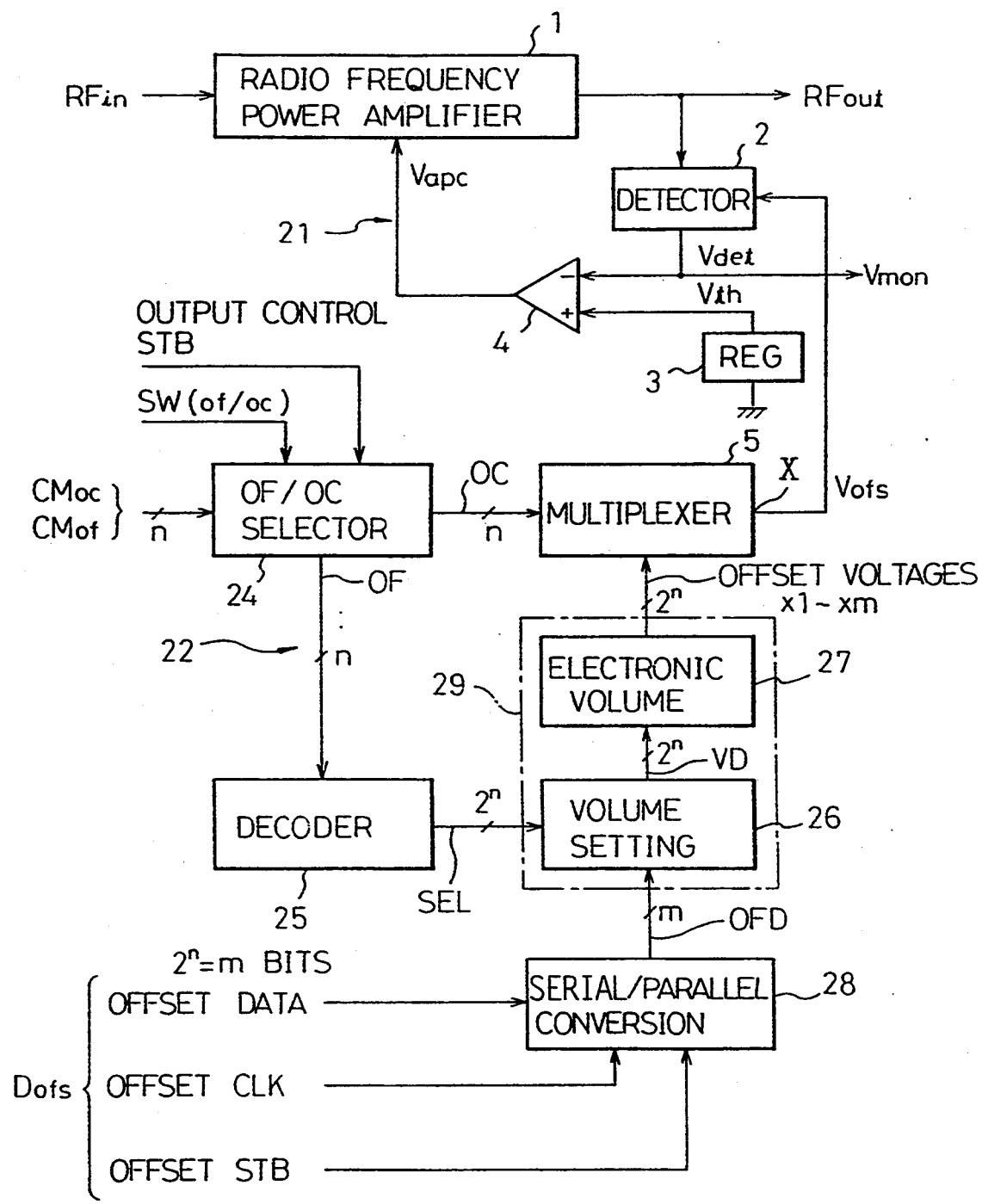
FIG. 4 is a view of an embodiment of a transmitter with an APC according to the present invention.

FIG. 4 is a view of an embodiment of a transmitter with an APC according to the present invention. The illustrated radio frequency power amplifier 1, the detector 2, the power regulator 3, the differential amplifier 4, and the multiplexer 5 which receives as input the $2^n = m$ predetermined DC voltages X1 to Xm, selects and outputs one among them, and generates offset voltages Vofs to switch the transmission output in $2^n$ steps (n=1, 2 . . . ) are the same as in the conventional example shown in FIG. 1. The components newly provided in the present invention are a selector 24 commonly used for offset setting and output control, which outputs as n-parallel offset setting data OF one of the processing outputs obtaining by processing under an AND operation, by a switching signal SW (of/oc) of an offset setting mode and an output control mode, data CMoc and CMof common for n-parallel offset setting and output control based on an external command and which latches the other of the processing outputs by an output control strobe (STB) signal from the outside and outputs the same as an n-parallel output control signal; a decoder 25 which converts the n-parallel offset setting data OF of the output of the selector 24 to $2^n$ selection signals SEL; a serial/parallel conversion circuit 28 which outputs $2^n(=m)$-parallel offset setting data OFD by $2^n$ bit offset serial data "OFFSET DATA" based on an external command CM and an offset clock "OFFSET CLK" and a latch control signal "OFFSET STB" based on the same external command; a volume setting circuit 26 which latches the $2^n(=m)$-parallel offset setting data OFD of the output of the conversion circuit 28 by $2^n$ signals SEL of the output of the decoder 25, performs digital-to-analog conversion on the analog signal, and outputs a volume setting data VD for setting $2^n$ resistance values; and electronic volumes 27 which produce and output $2^n$ predetermined offset voltages X1 to Xm from a constant voltage DC power source by one of $2^n$ variable resistors. The $2^n$ predetermined offset voltages X1 to Xm of the output of the electronic volumes 27 are input to the multiplexer 5 and the n-parallel output control signal OC of the output of the selector 24 is used as a selection signal to select one of the $2^n$ predetermined DC voltages of the electronic volumes 27 from the multiplexer 5, which is made the offset voltage Vofs.

The offset voltage sources 23 shown in FIG. 2 are realized as variable voltage source 29 in FIG. 4. The variable voltage source 29 is comprised, specifically in FIG. 4, of the electronic volumes 27 and volume setting circuits 26. Namely, the variable voltage source 29 is comprised of electronic volumes 27 which apply their inherent offset voltages Vofs to the multiplexer 5 and a volume setting circuit 26 which specifies the magnitude of the output voltages from the electronic volumes 27.

The operation will be described below.

In the serial/parallel conversion circuit 28, the $2^n = m$ bits of serial data "OFFSET DATA" of the external input are converted to parallel data. The converted m-parallel offset setting data OFD is input to the volume setting circuit 26. The selector 24 sends out the n-parallel setting data OF to the decoder 25 when the offset setting mode is selected by the mode switching signal SW (oc/of) for the offset setting mode and output control mode of the external input (CM). The decoder 25 converts the n-parallel offset setting data OF to $2^n = m$ volume selection signals SEL and sends the same to the volume setting circuit 26. The volume setting circuit 26 sends the volume setting data VD, obtained by D/A conversion of the $2^n = m$ parallel offset setting data OFD, based on the command CM, to the $2^n = m$ number of variable resistors of the electronic volumes 27 selected by the selection signal SEL. The electronic volumes 27 are instructed by the input volume setting data VD as to the resistance values of the variable resistors and output the $2^n = m$ offset voltages X1 to Xm from the constant voltage DC power source. The multiplexer 5, for which the input voltages X1 to Xm are determined by the electronic volumes 27, selects a desired one of the offset voltages from among the $2^n = m$ number of offset voltages X1 to Xm using the output control signal OC output by the selector 24 as a selection signal and outputs the same to the detector 2 as an offset voltage Vofs. In the detector 2, the bias voltage of the internal diode rises by exactly the offset voltage Vofs and the detection voltage Vdet of the output rises. The amount of the rise is inverted and amplified by the differential amplifier 4, whereby the control voltage Vapc to the radio frequency power amplifier 1 falls. By this, the gain of the radio frequency power amplifier 1 falls and the output power is lowered.

Therefore, even when the output of the radio frequency output amplifier 1 is to be controlled, it is possible to compare the detection voltage Vdet of the output of the detector 2 with the threshold voltage and arbitrarily and independently set $2^n = m$ offset voltages X1 to Xm by the variable resistors of the electronic volume 27.

Figure 5:
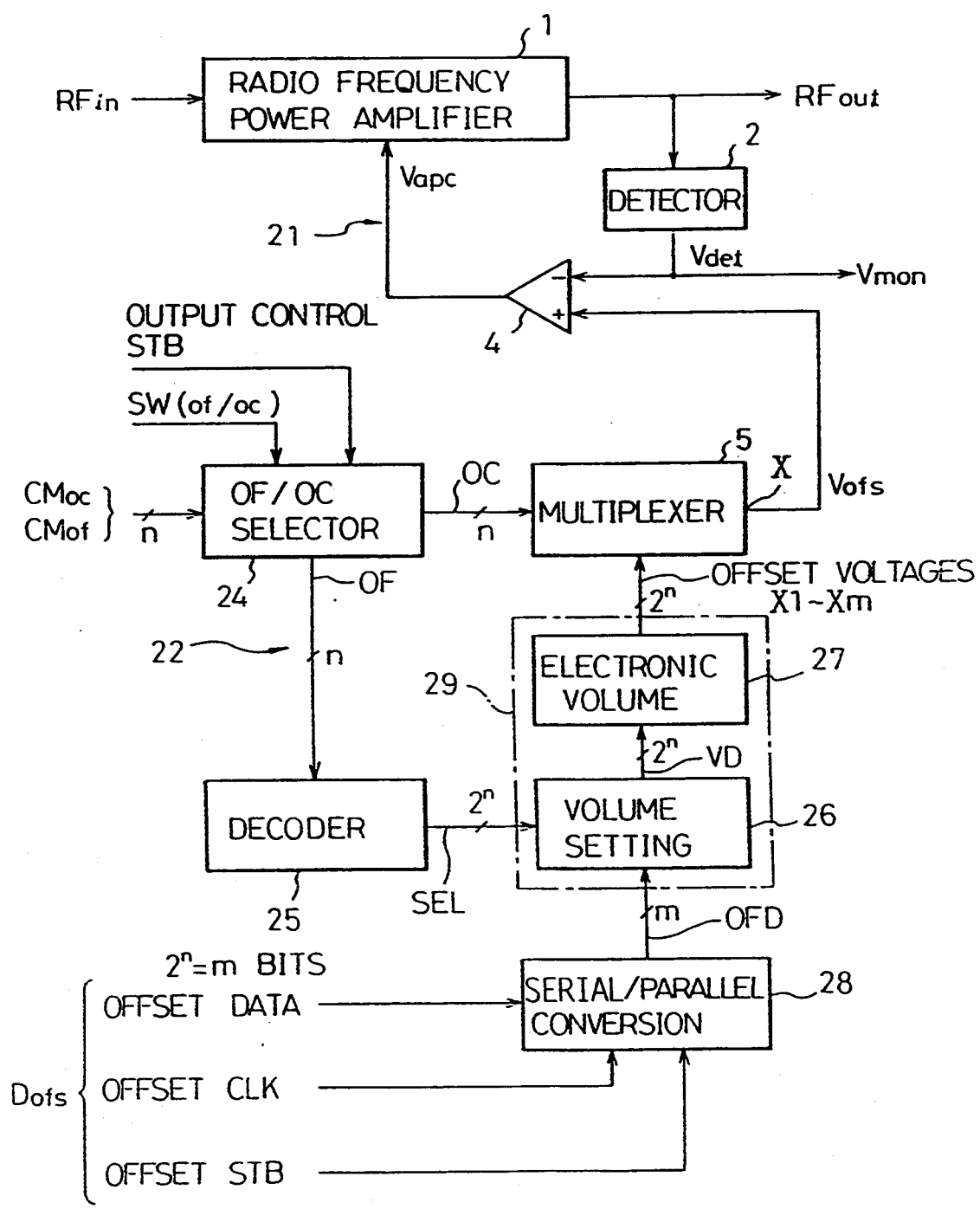
FIG. 5 is a view of a modification of the construction of FIG. 4.

FIG. 5 is a view of a modification of the construction of FIG. 4 and shows an example of the use of the offset voltage Vofs itself as the above-mentioned threshold voltage. Therefore, in this example, the bias voltage for the internal diode of the detector 2 is fixed.

Figure 6A:
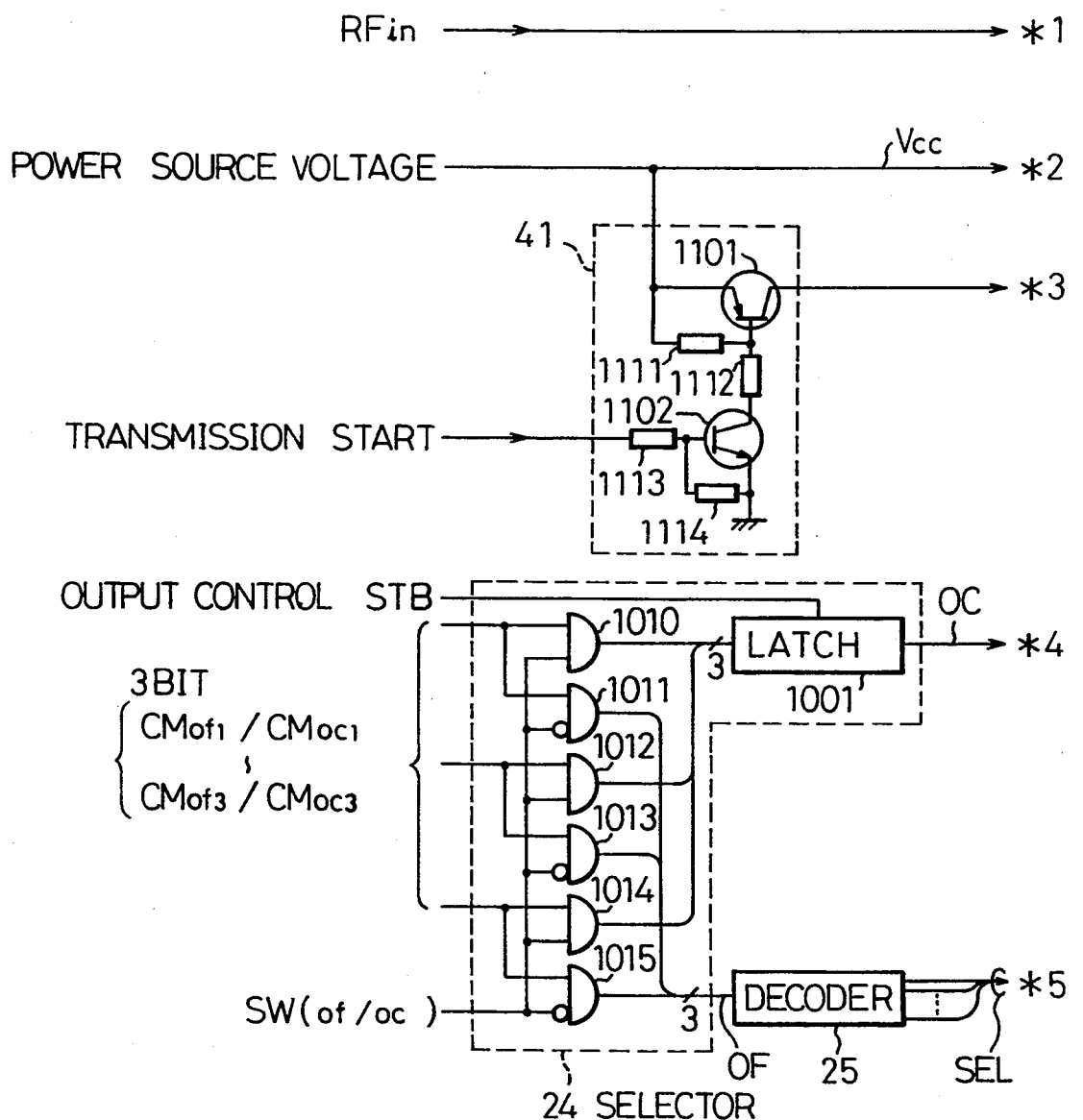
FIG. 6A and FIG. 6B are circuit diagrams of detailed examples of the construction of FIG. 4.
Figure 6B:
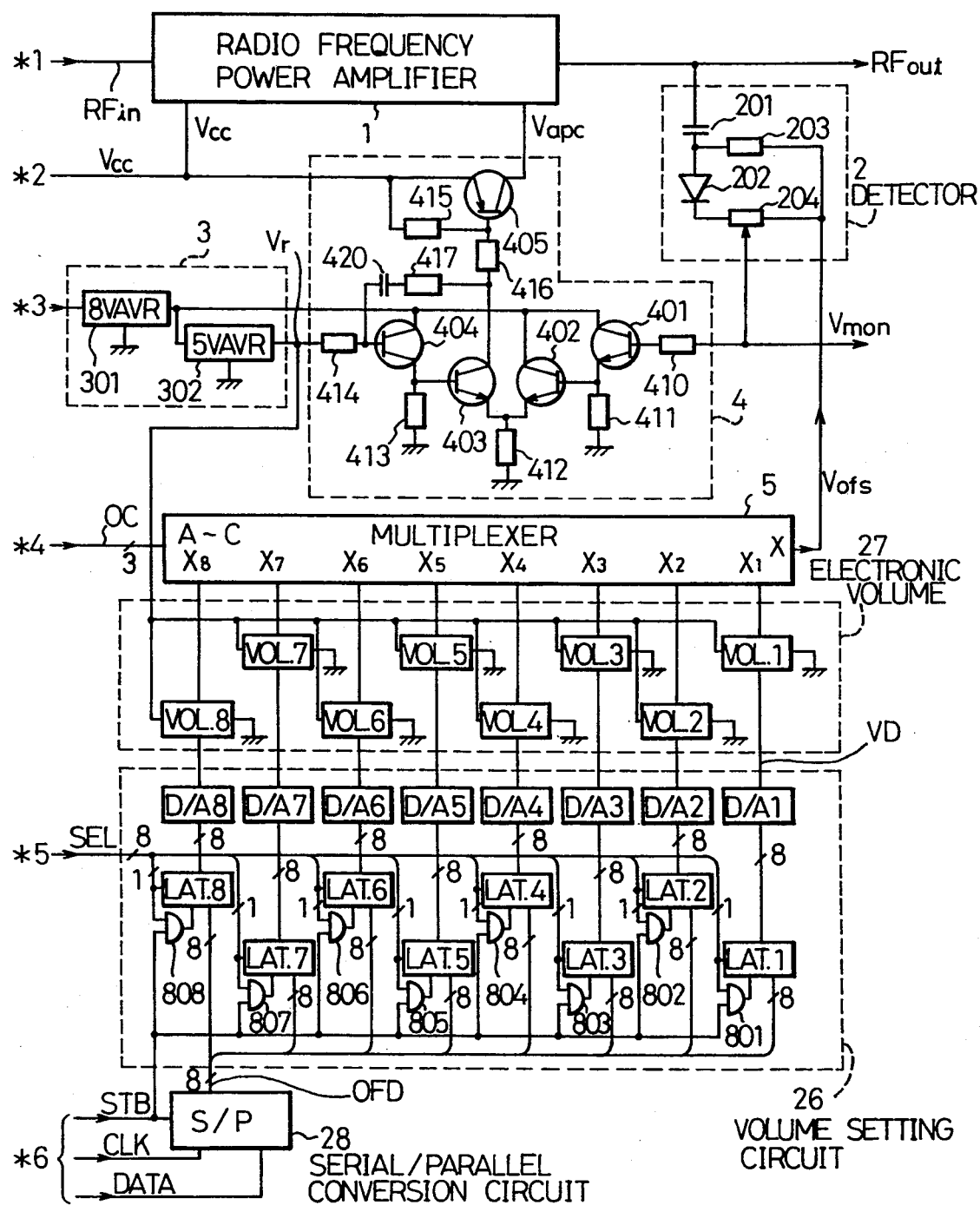
Figure 7A:
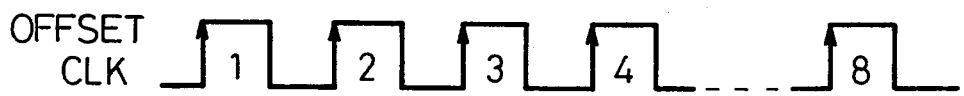
FIGS. 7A, 7B, 7C, and 7D are views of timing charts between a volume setting circuit and a serial/parallel conversion circuit.
Figure 7B:
Figure 7C:
Figure 7D:

FIG. 6A and FIG. 6B are circuit diagrams of a detailed example of the construction of FIG. 4. In the figure, 1, as mentioned earlier, is a radio frequency power amplifier, which amplifies the radio frequency input signal RFin by a gain determined by an automatic power voltage Vapc and outputs a radio frequency output signal RFout. Reference numeral 2 is a detector, which is comprised of a coupling capacitor 201, a detection diode 202, and offset voltage applying resistors 203 and 204. It receives as input a radio frequency output signal RFout, applies an offset voltage Vofs to the DC voltage obtained by detecting this, and outputs a detection voltage Vdet. Reference numeral 3 is, as mentioned earlier, a voltage regulator, which is comprised of an automatic voltage regulator (AVR) 301 of an 8V output and an automatic voltage regulator 302 of a 5V output. This outputs a reference voltage Vr. Reference numeral 4 is the above-mentioned differential amplifier, which is comprised of the transistors 401 to 405, resistors 411 to 417, and a capacitor 420. This inverts and amplifies the difference between the detection voltage Vdet and the threshold voltage Vth to make the control voltage Vapc of the radio frequency power amplifier 1. Reference numeral 5 is the above-mentioned multiplexer, which is controlled by the 3-bit control signal OC from the selector 24, selects a desired one of the eight DC voltages X1 to X8 from the electronic volume 27, outputs the same to the output port X, and outputs this as the offset voltage Vofs. Reference numeral 6 is the above-mentioned 3-bit decoder, which receives as input the 3-bit offset setting data CMof of the output of the selector 24, common to the offset setting and output control (of/oc) modes, and outputs $2^3 = 8$ volume selection signals SEL. Reference numeral 28 is a serial/parallel converter, which converts the 8-bit serial data offset data "OFFSET DATA" based on an external command to parallel data offset setting data OFD. Reference numeral 26 is the above-mentioned volume setting circuit, which is comprised of eight 8-bit D/A converters D/A1 to D/A8, eight 8-bit latches LAT1 to LAT8, and eight AND gates 801 to 808. Reference numeral 27 is the above-mentioned electronic volume, which is comprised of eight variable resistors VOL1 to VOL8. Reference numeral 24 is a selector used commonly for the offset setting and output control and is comprised of the six AND gates 1010 to 1015 and the 3-bit latch 1001. Reference numeral 41 is a transmission start switch, which turns the power source voltage Vcc of the radio frequency power amplifier 1 on and off and turns the power source of the APC on and off. It is comprised of the two transistors 1101 and 1102 and the four resistors 1111 to 1114. RFin is the radio frequency input signal of the radio frequency power amplifier 1, RFout is the radio frequency output signal of the same, and Vapc is the control voltage. CMof/CMoc is a 3-bit signal used commonly for the offset setting and output control based on an external command and is input to the six AND gates 1010 to 1015 forming the selector 24 for switching between the offset setting and output control modes. It is inverted in sign and input to the three AND gates 1011, 1013, and 1015 forming the offset setting-/output control selector 24. The output control STB signal is the 1-bit output control STB signal forming the external command and is input to the latch 1001 inside the selector 24 switching between the offset setting and output control modes. The operation will be described below:

The circuit of FIG. 6A and FIG. 6B is able to change in $2^3 = 8$ steps the output power obtained by amplifying the radio frequency output signal RFin to the radio frequency power amplifier 1 and has the ability of holding constant and finely adjusting the output level of the same. Assume for example that the output power of 39 dBm is changed in eight steps of 4 dB to 11 dBm. That is, with a 39 dBm output, the offset voltage Vofs becomes 0V, with a 35 dBm output, it becomes 1.53V, with a 31 dBm output, it becomes 2.46V, with a 27 dBm output, it becomes 2.02V, with a 23 dBm output, it becomes 3.42V, with a 19 dBm output, it becomes 3.65V, with a 15 dBm output, it becomes 3.78V, and with an 11 dBm output, it becomes 3.88V.

In the operation for setting the initial state, "0,0,0" is input to the offset setting 1 to offset setting 3 CMofl to CMof3 of the 3-bit signal. When the 1-bit switching signal SW (of/oc) between the offset setting mode and the output control mode becomes "0" (usually, the output control mode is in effect, so it is "1"), the AND gates shown by 1011, 1013, and 1015 are made active. Then, "0,0,0" is sent to the decoder 25, a volume selection signal SEL is sent from the decoder 25 to the volume setting circuit 26, and the corresponding latch LAT1 is selected. In this state, the latch LAT1 can receive input of data from the outside. The $2^3 = 8$ bits of offset data "OFFSET DATA" based on the external command are loaded into the serial/parallel conversion circuit 29 in synchronization with the offset clock "OFFSET CLK". When all the 8 bits finish being loaded, the offset strobe "OFFSET STB" is input to the serial/parallel conversion circuit 28 and the 8 bits of data are output as the offset setting data OFD. Simultaneously with this, the latch clock is sent from the AND gate 801 to the latch LAT1 and the offset setting data OFD is fetched into the latch LAT1. This being done, since the digital signal of the input of the 8-bit D/A converter D/A1 is determined, the analog signal corresponding to that data is input to the variable resistor VOL1 of the electronic volume 27 as the volume setting data VD and the offset voltage X1 of the output is determined. Similarly, the logic of the offset setting 1 to offset setting 2 of the 3-bit signal are changed one by one to preset the offset voltages X2 to X8.

The fine adjustment of the offset voltage Vofs during the operation of the transmitter (on air), is performed as follows: For example, when finely adjusting the output level at the step of the 39 dBm output, the output of the group of AND gates shown by 1010, 1012, and 1014, when in the mode switching signal SW (of/oc) of the offset setting mode/output control mode, to the output control 1 and the output control 3 CMoc1 to CMoc3 is fetched into the latch circuit LATCH shown by 1001. When this ends, the mode switching signal SW (of/oc) of the offset setting mode/output control mode is made "0" to select the offset setting mode. The volume selection signal SEL is then output from the decoder 25, and the volume setting circuit 26 selects the latch LAT1. In this state, the latch LAT1 becomes able to receive input of data from the outside. After this, the operation is the same as the operation for setting the initial state described above.

In this way, if the D/A converter D/A1 inside the volume setting circuit 26 is an 8-bit D/A converter, it is possible to finely adjust and change the offset voltage Vofs between 0V to 5V DC with a resolution of $5V/2^8 = 19.5$ mv steps. This is possible even during transmission.

FIGS. 7A, 7B, 7C, and 7D are views of timing charts between the volume setting circuit and serial/parallel conversion circuit. The signals of FIGS. 7A, 7B, and 7C correspond to the three types of signals shown at the bottom left of FIG. 6A, and the signal of FIG. 7D corresponds to the output of the AND gates (801 to 808), that is, the above-mentioned latch clock. Each of the volume setting circuits 26 is comprised of a latch circuit (LAT1 to LAT8) which cooperates with the serial/parallel conversion circuit 28 and converts serial bit offset setting data "OFFSET DATA" given along with the external command CM to parallel bit offset setting data by the serial/parallel conversion circuit 28 and receives the same and an AND gate (801 to 808) which allows passage of a timing signal for causing one-time transfer of data to the latch circuit at the timing when one word's worth (for example, 8 bits shown in FIG. 7A) of the bits of the offset setting data are stored in the serial/parallel conversion circuit 28. The AND gates are opened selectively in accordance with the output of the decoder 26.

The above-mentioned electronic volumes (VOL. 1 to VOL. 8) can be realized by so-called analog switches. The analog switches are fabricated by FET's and are used for forming the multiplexer 5 as well.

Figure 8:
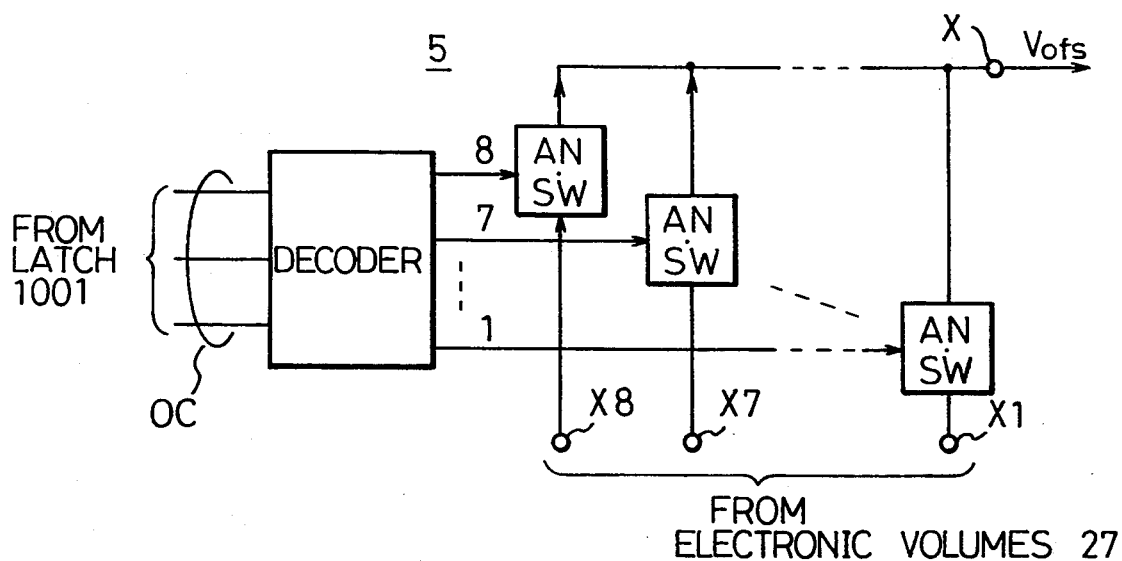
FIG. 8 is a view of an example of a multiplexer.

FIG. 8 is a view of an example of a multiplexer. It gives eight types of signals obtained by decoding an output control signal OC (3 bits) by a decoder to eight analog switches (AN SW), opens one of the analog switches, and outputs an offset voltage Vofs.

As explained above, according to the present invention, the generating unit of the offset voltage for controlling the output in the case where a transmitter has an APC for switching the output power separately in $2^n$ steps is not made the series resistor type as in the past, but is made an electronic volume type which can be preset electronically by data, so it is possible to set the offset voltage to any value and possible to independently and easily perform fine adjustment of the output power during transmission. Therefore, for example, even if the models of radio frequency power amplifiers differ, there are the merit that it is possible to cope with changes in the offset voltage with the identical circuit and the merit that all the circuits can be constructed by digital circuits, thereby being advantageous for fabrication in an integrated circuit and contributing to the reduction in size of the apparatus.

I claim:

1. A transmitter having an automatic power controller comprising:
   a radio frequency power amplifier for amplifying a radio frequency input signal by a gain determined in accordance with an automatic power control voltage;
   first means for branching and receiving a radio frequency output signal from the radio frequency power amplifier, for producing a voltage proportional to a deviation of the received signal from a threshold voltage, and for giving feedback to the radio frequency power amplifier using said voltage proportional to said deviation as the control voltage; and
   second means for generating an offset voltage to be superposed on the threshold voltage in accordance with an external command,
   wherein the second means includes
   a multiplexer which outputs the offset voltage;
   a plurality of offset voltage sources which generate mutually independently preset offset voltages in accordance with the external command; and
   a selector which controls the multiplexer to select one of said offset voltage sources, to independently generate an offset voltage from among the plurality of offset voltage sources, and to select from among the plurality of offset voltage sources in accordance with the external command the one of said offset voltage sources corresponding to the offset voltage to be superposed on the threshold voltage.

2. A transmitter as set forth in claim 1, wherein said selector successively selects the plurality of offset voltage sources and presets the offset voltages to be allocated to the same in accordance with said external command to set the offset voltages.

3. A transmitter as set forth in claim 2, wherein said external command is issued in accordance with offset information stored in advance in a read only memory (ROM) provided in said transmitter.

4. A transmitter as set forth in claim 2, wherein an offset setting mode and an output control mode for changing a state of selection in the multiplexer when the transmitter is transmitting are switched by said selector.

5. A transmitter as set forth in claim 1, wherein said selector leaves a state of selection in the multiplexer as is when the transmitter is transmitting, selects one of the offset voltage sources in a selected state, and performs further final adjustment on the selected offset voltage in accordance with said external command.

6. A transmitter as set forth in claim 5, wherein said external command is a command issued and transmitted at an opposing base station with which the transmitter is communicating and received at the transmitter.

7. A transmitter as set forth in claim 5, wherein said external command is a command issued in said transmitter in accordance with results from monitoring of said radio frequency output signal received in said first means.

8. A transmitter having an automatic power controller comprising:
   a radio frequency power amplifier for amplifying a radio frequency input signal by a gain determined by an automatic power control voltage;
   a detector for detecting an output signal of said radio frequency power amplifier;
   a differential amplifier for outputting an automatic power voltage having a level proportional to a deviation of the magnitude of the detected output from a threshold voltage; and
   a multiplexer for selecting any one voltage from among $2^n$ number of predetermined DC voltages by n parallel output control signals given to the multiplexer and outputs an offset voltage for switching in $2^n$ steps the level of the output of the said radio frequency power amplifier applied to the detector;

a common selector for offset setting and output control which outputs as n-parallel bit offset setting data a processing output obtained by processing under an AND operation, by a switching signal SW (of/oc) of an offset setting mode and an output control mode, data common for setting n-parallel offsets and for output control based on an external command, and for latching other processing outputs by an outside output control strobe signal and outputting the other processing outputs as an n-parallel bit output control signal;

a decoder for converting the n-parallel bit offset setting data of the output of the selector to $2^n$ selection signals;

a serial/parallel conversion circuit for outputting $2^n$ (=m) parallel bit offset setting data by $2^n$ bit offset serial data based on an external command and an offset clock and a latch control signal based on the external command;

a volume setting circuit for latching the $2^n$ (=m) parallel bit offset setting data of the output of the serial/parallel conversion circuit by $2^n$ number of signals of the output of the decoder, performs digital-to-analog conversion to produce analog signals from the $2^n$ (=m) parallel offset setting data based on the external command, and outputs volume setting data for setting $2^n$ resistance values; and an electronic volume for producing and outputting $2^n$ number of predetermined offset voltages from a constant voltage DC power source by one of $2^n$ variable resistors, the $2^n$ number of predetermined offset voltages of the output of the electronic volume being input to the multiplexer and the n-parallel output control signal of the output of the selector being used as a selection signal to select one of the $2^n$ predetermined DC voltages of the electronic volumes from the multiplexer, which is made to be the offset voltage.

9. A transmitter having an automatic power controller comprising:

a radio frequency power amplifier for amplifying a radio frequency input signal by a gain determined in accordance with an automatic power control voltage;

first means for branching and receiving a radio frequency output signal from the radio frequency power amplifier, for producing a voltage proportional to a deviation of the received signal from a threshold voltage, and for giving feedback to the radio frequency power amplifier using said voltage proportional to said deviation as the control voltage; and second means for generating an offset voltage to be superposed on the threshold voltage in accordance with an external command, wherein the second means is comprised of a multiplexer which outputs the offset voltage;

a plurality of offset voltage sources which generate mutually independently preset offset voltages in accordance with the external command; and a selector which controls the multiplexer to select one of said offset voltage sources, independently generating an offset voltage from among the plurality of offset voltage sources, and to select from among the plurality of offset voltage sources in accordance with the external command the one of said offset voltage sources corresponding to the offset voltage to be superposed on the threshold voltage; wherein said selector successively selects the plurality of offset voltage sources and presets the offset voltages to be allocated to the same in accordance with said external command to set the offset voltages;

an offset setting mode and an output control mode for changing a state of selection in the multiplexer when the transmitter is transmitting are switched by said selector; and said detector is comprised of:

a first group of AND gates which are open when the offset setting mode is indicated, select one of the offset voltage sources in accordance with said external command, and finely adjust the voltage of the offset voltage source selected in accordance with the external command;

a second group of AND gates which become open when the output control mode is switched to by said selector and output a signal for controlling the selection in the multiplexer to the multiplexer; and a latch circuit which holds the signal which is output by the second AND gate group.

10. A transmitter as set forth in claim 9, wherein said offset voltage sources are comprised of variable voltage sources which can be changed in output voltage in accordance with the external command, with one variable voltage source indicated by said external command being selected through a decoder which decodes the signal output by said second AND gate group.

11. A transmitter as set forth in claim 10, wherein each of said variable voltage sources is comprised of an electronic volume which applies an inherent offset voltage to the multiplexer and a volume setting circuit which indicates the magnitude of an output voltage from the electronic volume.

12. A transmitter as set forth in claim 11, wherein said volume setting circuit is comprised of at least one latch circuit which cooperates with serial/parallel conversion circuit and converts serial bit offset setting data given along with the external command to parallel bit offset setting data by the serial/parallel conversion circuit and receives the same, and an AND gate which allows passage of a timing signal for causing package transfer to the latch circuit at the timing when one word of bits of the offset setting data is stored in the serial/parallel conversion circuit, the AND gate which allows passage being opened selectively in accordance with the output of the decoder.

* * * * *